United States Patent
Kim et al.

(10) Patent No.: US 8,045,390 B2
(45) Date of Patent: Oct. 25, 2011

(54) MEMORY SYSTEM WITH DYNAMIC REFERENCE CELL AND METHOD OF OPERATING THE SAME

(75) Inventors: Jongoh Kim, Hsinchu (TW); Yi-Jin Kwon, Hsinchu (TW); Cheng-Jye Liu, Jhongli (TW)

(73) Assignee: Macronix International Co., Ltd., Hsinchu (TW)

( * ) Notice: Subject to any disclaimer, the term of this patent is extended or adjusted under 35 U.S.C. 154(b) by 357 days.

(21) Appl. No.: 12/053,411

(22) Filed: Mar. 21, 2008

(65) Prior Publication Data

US 2009/0237991 A1     Sep. 24, 2009

(51) Int. Cl.
*G11C 11/34* (2006.01)
*G11C 16/16* (2006.01)

(52) U.S. Cl. ........... 365/185.21; 365/185.2; 365/207; 365/210.1; 365/210.12

(58) Field of Classification Search ........... 365/185.2, 365/185.21, 207, 210.1, 210.12
See application file for complete search history.

(56) References Cited

U.S. PATENT DOCUMENTS

| | | | | |
|---|---|---|---|---|
| 5,390,147 A | * | 2/1995 | Smarandoiu et al. | 365/185.21 |
| 5,400,286 A | * | 3/1995 | Chu et al. | 365/185.19 |
| 5,517,453 A | * | 5/1996 | Strain et al. | 365/185.12 |
| 6,799,256 B2 | | 9/2004 | Van Buskirk et al. | |
| 6,813,189 B2 | | 11/2004 | Kurihara | |
| 6,912,160 B2 | * | 6/2005 | Yamada | 365/185.2 |

* cited by examiner

*Primary Examiner* — Tuan Nguyen
*Assistant Examiner* — Lance Reidlinger
(74) *Attorney, Agent, or Firm* — Jianq Chyun IP Office

(57) ABSTRACT

A system for operating a memory device includes a memory array having a number of memory cells and a set of dynamic reference cells coupled to the memory cells in word lines. Each of the dynamic reference provides the associated memory cells with a dynamic reference value for determining a status of at least one of the associated memory cells. The dynamic reference value is capable of reflecting a variation in a threshold value of at least one of the associated memory cells.

10 Claims, 4 Drawing Sheets

MEMORY SYSTEM WITH DYNAMIC REFERENCE CELL AND METHOD OF OPERATING THE SAME

DESCRIPTION OF THE INVENTION

1. Field of the Invention

The present invention relates generally to a memory device and, more particularly, to a system and method of operating a memory device.

2. Background of the Invention

Flash memory is a type of non-volatile memory which can be written to and erased multiple times and can retain its content without consumption of power. Nitride read only memory (NROM), a type of flash memory, may include an N row by M column array of NROM cells for data storage. Each NROM cell may include a metal oxide semiconductor (MOS) transistor having a source, a drain and a stacked gate structure forming on a P-type substrate. The gate structure may include a polysilicon layer overlaying an oxide/nitride/oxide (ONO) stacked layer, with the nitride layer serving as an electron trapping layer.

Each NROM cell may store one or more bits of data. For example, dual bit memory devices allow storage of two bits of data in a single cell, one bit being stored in the trapping layer proximate to the source region and the other being stored in the trapping layer proximate to the drain region. The presence or absence of negative changes in one area of the trapping layer may represent the status of the corresponding bit.

In multi-bit memory devices that utilize an ONO stacked layer to store charges, the charge added or removed during the programming and erase operations should be confined to the respective source and drain regions of a cell. However, in reality, the buildup and removal of charges in one of the source and drain regions may affect the charge in the other region, thus changing the reading, programming and erase characteristics of the cell over time. Eventually, the buildup of charges changes the threshold voltages for determining the state of the respective bits in a cell. The shift in threshold voltages due to the interactions between the two regions of a cell is generally known as bit disturb. Additionally, charge loss after repeated cycling of the memory cell also causes a shift in the threshold voltages, especially the program threshold voltage. The change in threshold voltages, which occurs as a result of bit disturb and/or charge loss, prevents a memory device from correctly sensing the state of each bit of the cells.

The state of each bit of a multi-bit cell, including a programmed state or in an erased state, is determined by comparing the value from a memory cell (e.g., the voltage level of a data bit) with a reference value. Generally, reference cells are pre-programmed and set to an erased state during initial manufacturing so that a stable reference value may be provided. When the value from the memory cell is greater than the reference value, the memory cell is determined to be in an erased state. On the other hand, when the value from the memory cell is less than the reference value, the memory cell is determined to be in a programmed state. FIG. 1 illustrates a diagram illustrating sensing margin of a memory device. Line 102 represents the ideal program threshold voltage of a memory cell over time. Line 104 represents an example of the change in the program threshold voltage of the memory cell over time considering effects such as bit disturb and charge loss. Line 106 represents the ideal erase threshold voltage of the memory cell over time. Line 108 represents an example of the change in the erase threshold voltages of the memory cell over time considering effects such as bit disturb and charge loss. Line 110 represents the reference value provided by a reference cell of a memory device in the prior art, which remains a constant value over time as shown in FIG. 1. Referring to FIG. 1, due to effects such as bit disturb and/or charge loss effect, the sensing margin 112 between the reference value 110 and the program threshold voltages 104 of the memory cell may decrease over time, which may increase the possibility of sensing errors and reduce the reliability of memory devices.

SUMMARY OF THE INVENTION

One example consistent with the invention provides a system for operating a memory device. The memory device may include: a memory array having a number of memory cells, a number of word lines each coupled to at least one of the memory cells in a corresponding row, a number of bit lines each coupled to at least one of the memory cells in a corresponding column, and a number of dynamic reference cells each coupled to one of the word lines to provide a dynamic reference value for determining a status of at lease one of the associated memory cells. The dynamic reference value is capable of reflecting a variation in a threshold value of at least one of the associated memory cells.

In another example, a system for operating a memory device may include: a memory array having a number of memory cells, a number of word lines each coupled to at least one of the memory cells in a corresponding row, a number of bit lines each coupled to at least one of the memory cells in a corresponding column, a number of dynamic reference cells each coupled to one of the word lines for providing a dynamic reference value for determining a status of at lease one of the associated memory cells, and a control circuit for programming the dynamic reference cells so that the dynamic reference value is capable of reflecting a variation in a threshold value of at least one of the associated memory cells.

Another example consistent with the invention provides a method of operating a memory device. The method may include: programming a dynamic reference cell, generating a dynamic reference value capable of reflecting a variation in a threshold value of a memory cell, reading a cell value from the memory cell, and determining a status of the memory cell based on the dynamic reference value.

It is to be understood that both the foregoing general description and the following detailed description are exemplary and explanatory only and are not restrictive of the invention, as claimed.

BRIEF DESCRIPTION OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

Figure 1:
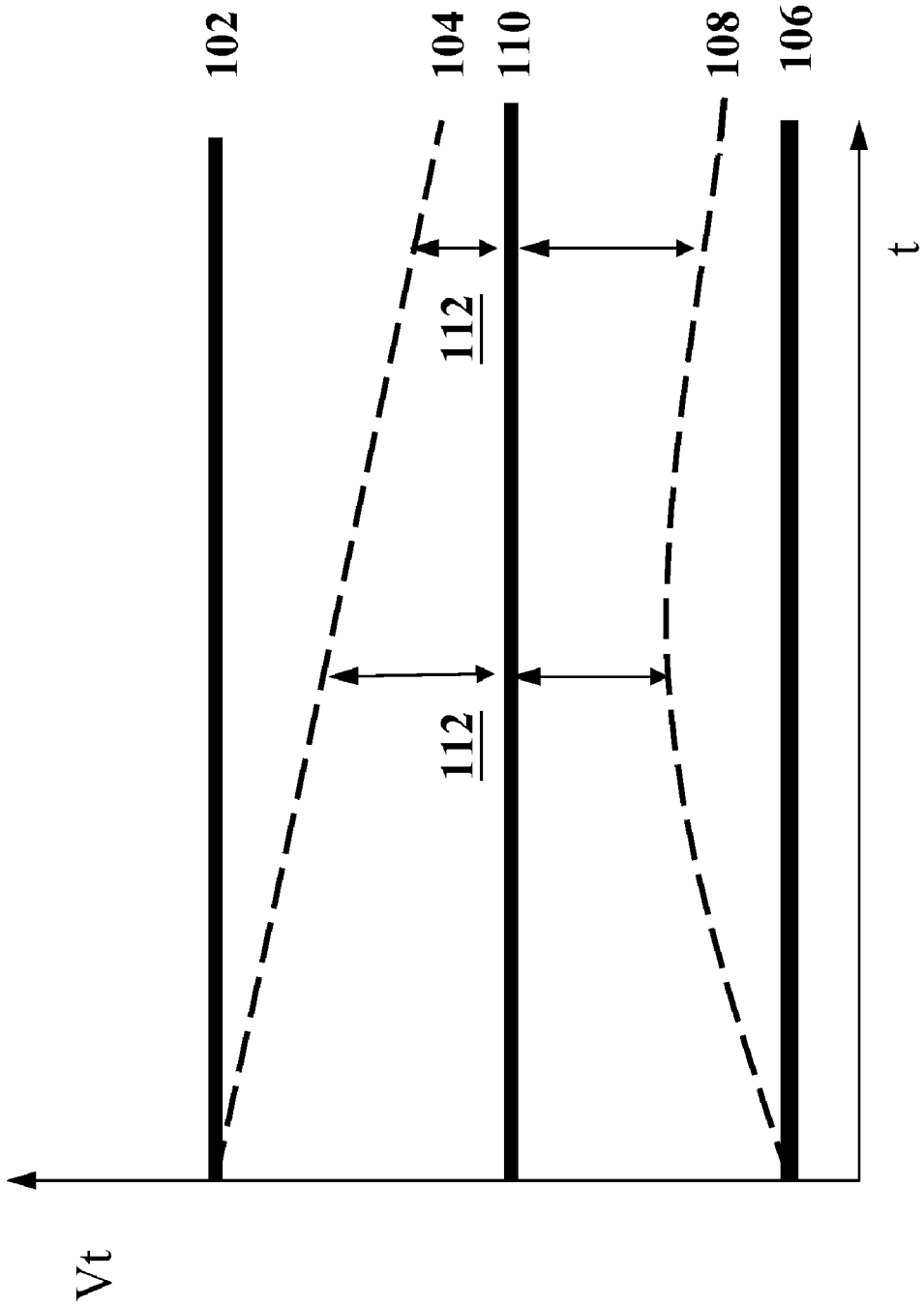
FIG. 1 is a diagram of the sensing margin of a memory device in the prior art.
Figure 2:
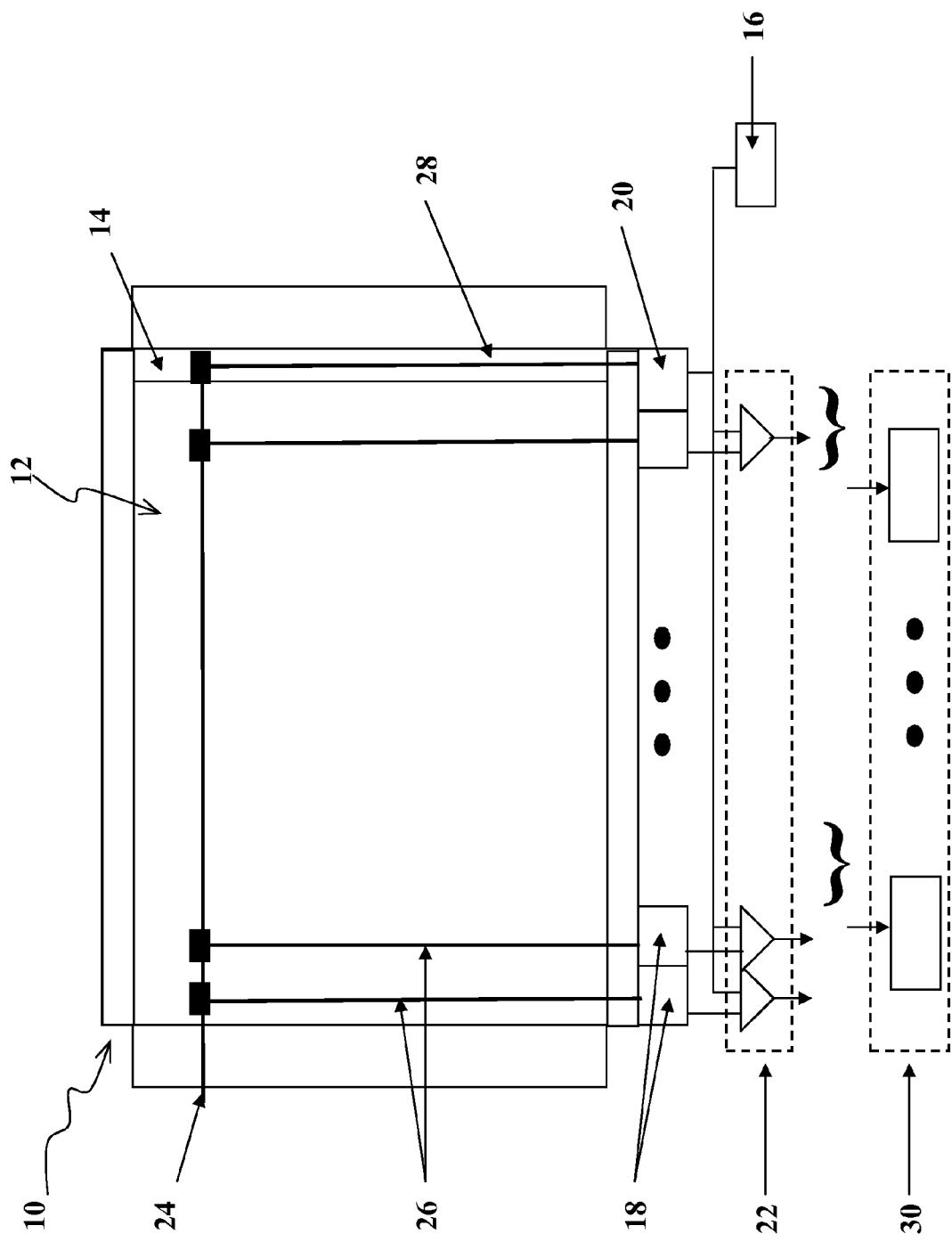
FIG. 2 is a block diagram of an exemplary embodiment of an NROM memory according to the present invention.

FIG. 2 illustrates an exemplary diagram of a system 10 for operating a memory device, such as an NROM array in examples consistent with the invention. The system 10 may includes a memory array 12, a set of dynamic reference cells 14, a mini-cell reference array 16, a number of main sensing amplifiers 18, a dynamic reference sensing amplifier 20, a number of comparators 22 and a number of Input/Output (I/O) circuits 30.

In one example, the system 10 may be provided over a single substrate. The substrate may have one or more high density regions and a low density peripheral region. One or more M×N memory arrays 12 may be placed in the high density regions. In one example, the dynamic reference cells 14 neighbor the memory array 12 in one of the high density regions of the substrate. The peripheral region includes sensing amplifiers 18 and 20, comparators 22 and I/O circuits 30. In one example, the mini-cell reference array 16 with a number of mini reference cells may also be placed in the peripheral region.

The memory array 12 may include a number of memory cells arranged in M columns and N rows. Each of the memory cells may include a MOS transistor with a stacked gate structure. The stacked gate structure may include a polysilicon layer over an ONO layer having a silicon nitride layer sandwiched between two silicon dioxide layers. The memory cells in the same row may be connected via a word line 24 while the memory cells in the same column may be connected via a bit line 26. In other words, a system 10 may have a number of word lines 24 each coupled to one or more memory cells in a corresponding row and a number of bit lines 26 each coupled to one or more memory cells in a corresponding column.

The set of dynamic reference cells 14 may include a number of dynamic reference cells which are connected to each other via a bit line 28. The dynamic reference cells may be placed next to and coupled to the memory array 12. In one example, each of the dynamic reference cells is coupled to the memory cells via the word line of that row. Each of the dynamic reference cells provides a dynamic reference value, such as a read threshold voltage in one example, for the associated memory cells to determine a status of the memory cells. By sharing the same word lines with the memory cells, each of the dynamic reference cells may operate through the same cycles as the associated memory cells and thereby experiencing the same or similar effects as those on the memory cells, such as charge loss.

The mini-cell reference array 16 includes at lease one mini reference cell which is coupled to each of the main sensing amplifiers 18 for providing a static reference value. The mini reference cell may be programmed once by memory manufacturers with a fixed value so that it is substantially stable over time. In one example, where the dynamic reference cells may provide dynamic reference values in read mode of the system 10, the mini-cell reference array 16 may provide a stable reference value for the memory cells in verify mode, such as program verify mode. In one example, the dynamic reference cells may provide the reference values for the memory cells both in read mode and verify mode of the system 10.

The main sensing amplifiers 18 and the dynamic reference sensing amplifier 20 may be placed in the peripheral region. Each of the main sensing amplifier 18 may be coupled to one of the bit line 26 for reading the cell value of one of the memory cells of that column. The dynamic reference sensing amplifier 20 may be coupled to the bit line 28 for reading the reference value of one of the dynamic reference cells.

Each of the comparators 22 may be connected to one of the main sensing amplifier 18, the dynamic reference sensing amplifier 20 as well as one of the mini-cell reference cells. The comparators 22 may be used to determine the status of a memory cell by, in one example, comparing the cell value provided by the associated main sensing amplifier 18 with the dynamic reference value provided by the dynamic reference sensing amplifier 20. Based on the comparison, the status of the memory cell may be determined. The comparison result may be subsequently provided to one of the I/O circuits 30 for output.

Figure 3:
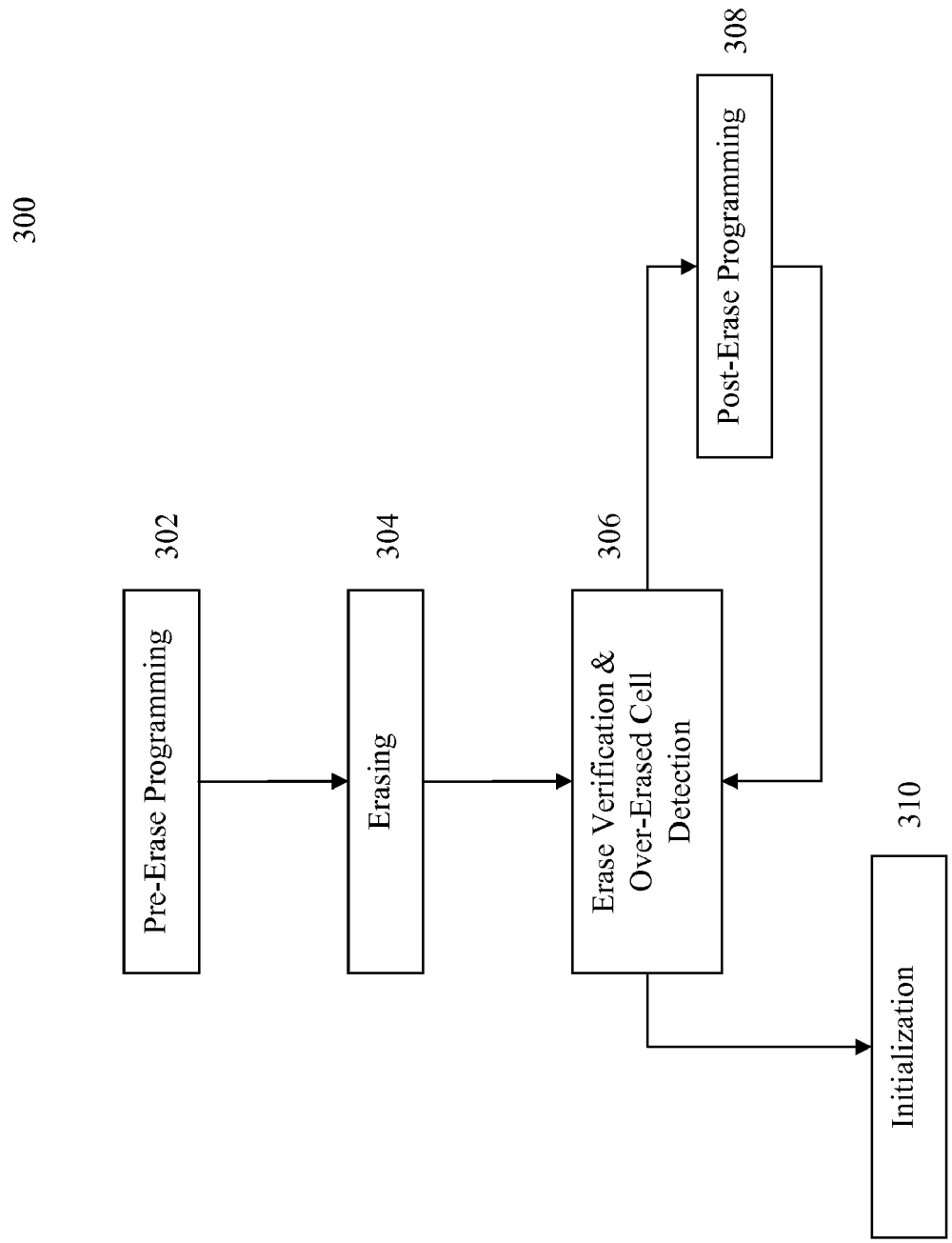
FIG. 3 is a flow chart showing an exemplary process of programming dynamic reference cells.

In some examples, the dynamic reference cells may be pre-programmed so that the reference values are variable depending on the programming threshold voltage (Program Vt) of the memory cells. As an example, the pre-programming may be conducted during the manufacturing process of a memory system. FIG. 3 is a flow chart showing an exemplary process 300 of programming dynamic reference cells. Referring to FIG. 3, the process may start with Step 302, pre-erase programming, during which a word line may be selected and a negative charge, such as a charge of about 0 to 10 volts, may be applied to the nitride storage layer of the associated memory cells. A number of charge pulses may be applied on the associated memory cells until the cell voltage passes the verification level. The number of pulses (i.e., pulse count) that is needed for passing the verification level may reflect the low boundary of the programming threshold voltage. The information of the pulse count may be recorded in a register or fuse which is also a type of memory cells responsible for storing operation-related information in association with the word line.

Following Step 302, a charge, such as a charge of about −5 to 5 volts, may be applied to erase the data in all of the memory cells at Step 304. Step 306, erase verification and over-erased cell detection, is subsequently performed to verify and detect whether or not the data in all of the memory cells is properly erased. For over-erased cells, Step 308, post-erase programming, is performed to apply negative charges to the over-erased cells. Steps 306 and 308 are repeated until all of the memory cells are verified as in erased state. Thereafter, the initialization of the dynamic reference cells is performed at Step 310 by programming (i.e., writing) the dynamic reference cells with the information of pulse count for each word line that is obtained in Step 302.

Figure 4:
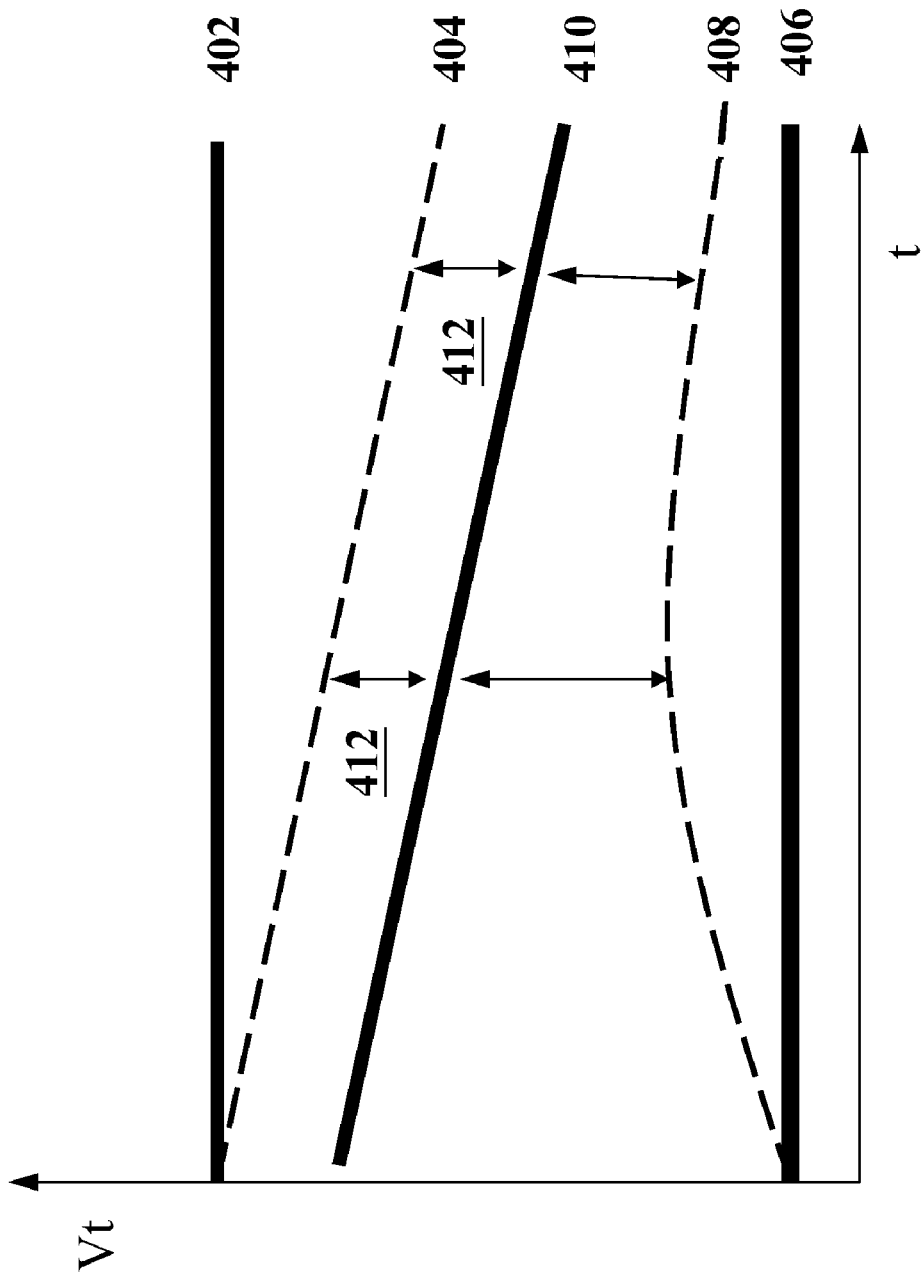
FIG. 4 is a diagram of the sensing margin of the exemplary embodiment of the present invention.

FIG. 4 is an exemplary diagram illustrating the sensing margin of an example consistent with the invention. Line 402 represents the ideal program threshold voltages of a memory cell, which maintains constant over time. Line 404 represents the variation in the program threshold voltage of the memory cell over time, which may be caused by effects such as bit disturb and charge loss. Line 406 represents the ideal erase threshold voltage of the memory cell, which similarly remains constant over time. 408 represents the variation in the erase threshold voltages of the memory cell over time, which may be caused by effects such as bit disturb and charge loss. Line 410 illustrates an example of the dynamic reference value provided by the dynamic reference cells. In one example, the dynamic reference value may be varied over time. For example, the dynamic reference value 410 may be programmed according the process described above to provide the associated memory with a reference value that is capable of reflecting the characteristics of the memory, which may vary over time. In one example, the difference between the reference value and the corresponding program threshold voltage 404 of the memory cell may be maintained substantially stable over time. In other words, the sensing margin 412 (i.e., the difference between the program threshold voltage 404 and the dynamic reference 410) may be substantially stable.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A system comprising:
    a memory array having a number of memory cells;
    a number of word lines each coupled to at least one of the memory cells in a corresponding row;
    a number of bit lines each coupled to at least one of the memory cells in a corresponding column;
    a set of dynamic reference cells, each dynamic reference cell being connected to one of the word lines to provide a dynamic reference value for determining a status of at least one of the memory cells coupled to a word line corresponding to the dynamic reference cell;
    a number of first sensing amplifier each coupled to the memory cells in a corresponding column for reading a cell value of at least one of the memory cells coupled to the corresponding word line;
    a second sensing amplifier coupled to the set of dynamic reference cells for reading a dynamic value from one of the dynamic reference cells;
    a mini-cell reference array providing a static reference value that remains substantially stable over time;
    a number of comparators each coupled to an associated first sensing amplifier and the mini-cell reference array as well as the second sensing amplifier for comparing the cell value, the dynamic reference value and the static reference value directly from the mini-cell reference array to determine a status of one memory cell in the corresponding column,
    wherein the dynamic reference value is capable of reflecting a variation in a threshold value of at least one of the memory cells coupled with the corresponding word line by sharing the same word lines with the memory cells, each of the dynamic reference cell operates through a same cycle as the associated memory cells, each cycle including a programming process and an erasing process.

2. The system of claim 1, wherein the set of dynamic reference cells neighbors the memory array.

3. The system of claim 1, wherein the dynamic reference cell is capable of maintaining a difference between the dynamic reference value and the threshold value of at least one of the memory cells coupled with the corresponding word line substantially stable.

4. The system of claim 1, further comprising a control circuit capable of programming the dynamic reference cells.

5. The system of claim 4, wherein the control circuit programs the dynamic reference cells with a low boundary of the threshold value of at least one of the memory cells connected to the corresponding word line.

6. The system of claim 5, wherein the set of dynamic reference cells neighbors the memory array.

7. The system of claim 5, wherein the dynamic reference cell is capable of maintaining a difference between the dynamic reference value and the threshold value of at least one of the memory cells coupled with the corresponding word line substantially stable.

8. A method of operating a memory device, the method comprising steps of:
    accessing a memory array having a number of memory cells;
    cycling including programming and erasing a dynamic reference cell coupled to one of a number of word lines each connected to at least one of the memory cells in a corresponding row, the dynamic reference cell capable of providing a dynamic reference value capable of reflecting a variation in a threshold value of a memory cell coupled with a word line;
    reading a cell value from the memory cell from a first sensing amplifier coupled to the memory cells in a corresponding column;
    reading the dynamic reference value from a second sensing amplifier coupled to the dynamic reference cell; and
    determining a status of the memory cell by comparing the cell value, the dynamic reference value and a static reference value directly from a mini-cell reference array through a comparator.

9. The method of claim 8, wherein programming the dynamic reference cell comprises programming the dynamic reference cell to maintain a difference between the dynamic reference value and the threshold value of the memory cell substantially stable.

10. The method of claim 8, wherein programming a dynamic reference cell comprises pre-erase programming the memory cell, obtaining a low boundary of the threshold value of the memory cell, programming the dynamic reference cell with the low boundary of the threshold value of the memory cell.

* * * * *